US006812123B2

(12) United States Patent
Matsumoto et al.

(10) Patent No.: US 6,812,123 B2
(45) Date of Patent: Nov. 2, 2004

(54) SEMICONDUCTOR DEVICES AND METHODS FOR MANUFACTURING THE SAME

(75) Inventors: Kazuki Matsumoto, Chino (JP); Yukio Morozumi, Chino (JP); Michio Asahina, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/818,743

(22) Filed: Mar. 27, 2001

(65) Prior Publication Data

US 2001/0033028 A1 Oct. 25, 2001

(30) Foreign Application Priority Data

Mar. 27, 2000 (JP) .................................... 2000-086607

(51) Int. Cl.[7] ....................... H01L 21/44; H01L 21/469; H01L 21/31
(52) U.S. Cl. ..................... 438/612; 438/783; 438/787
(58) Field of Search ............................ 438/612, 960, 438/790, 787, 783

(56) References Cited

U.S. PATENT DOCUMENTS

| | | | |
|---|---|---|---|
| 3,571,914 A | 3/1971 | Lands et al. .................. | 29/571 |
| 4,361,599 A | 11/1982 | Wourms ...................... | 427/90 |
| 4,824,803 A | 4/1989 | Us et al. | |
| 4,829,024 A | 5/1989 | Klein et al. .................. | 437/189 |
| 4,829,363 A | 5/1989 | Thomas et al. ............... | 357/71 |
| 5,202,579 A | 4/1993 | Fujii et al. ................... | 257/751 |
| 5,371,042 A | 12/1994 | Ong ............................ | 437/194 |
| 5,427,666 A | 6/1995 | Mueller et al. ......... | 204/192.17 |
| 5,482,884 A | 1/1996 | McCollum et al. ........... | 437/60 |
| 5,504,043 A | 4/1996 | Ngan et al. .................. | 437/247 |
| 5,523,259 A | 6/1996 | Merchant et al. | |
| 5,627,391 A | 5/1997 | Shimada et al. ............. | 257/310 |
| 5,691,571 A | 11/1997 | Hirose et al. ................ | 257/751 |

(List continued on next page.)

FOREIGN PATENT DOCUMENTS

| | | |
|---|---|---|
| JP | 59-032143 | 2/1984 |
| JP | 59-172745 | 10/1984 |
| JP | 03-227540 | 10/1991 |

(List continued on next page.)

OTHER PUBLICATIONS

Notice of Reasons of Rejection for Japanese Patent Application No. 2000–086607 (from which priority is claimed in U.S. Ser. No. 09/818,743), which lists JP10–233443, JP07–078821, JP09–092717, JP59–032143, JP03–227540, JP11–145134 and JP2000–100816.

Notice of Reasons of Rejection for Japanese Patent Application No. 2000–086607 (from which priority is claimed in U.S. Ser. No. 09/818,743), dated Jun. 10, 2003, which lists JP11–145134, JP11–317452, JP11–121458, JP06–005653 and JP2000–188333.

Notice of Reasons of Rejection for Japanese Patent Application No. 2000–086608 (from which priority is claimed in U.S. Ser. No. 09/817,935), dated Mar. 18, 2003, which lists JP10–233443 and JP59–172745.

U.S. application Ser. No. 09/817,935, filed Mar. 27, 2001— copy of application and drawings as filed and pending claims.

*Primary Examiner*—Alexander Ghyka
(74) *Attorney, Agent, or Firm*—Konrad, Raynes & Victor, LLP; Alan S. Raynes

(57) ABSTRACT

Certain embodiments of the present invention relate to a semiconductor device that has a pad section having an excellent coherency with an interlayer dielectric layer, and a method for manufacturing the same. A semiconductor device 1000 has a pad layer 30A formed over an interlayer dielectric layer 20. The interlayer dielectric layer 20 includes at least a first silicon oxide layer 20b that is formed by a polycondensation reaction of a silicon compound and hydrogen peroxide, and a second silicon oxide layer 20c formed over the first silicon oxide layer and containing an impurity. The pad section 30A includes a wetting layer 32, an alloy layer 34 and a metal wiring layer 37.

13 Claims, 5 Drawing Sheets

U.S. PATENT DOCUMENTS

| | | | |
|---|---|---|---|
| 5,712,194 A | 1/1998 | Kanazawa | 437/194 |
| 5,716,890 A | 2/1998 | Yao | 438/624 |
| 5,811,849 A | 9/1998 | Matsuura | 257/306 |
| 5,877,086 A | 3/1999 | Aruga | 438/653 |
| 5,918,149 A | 6/1999 | Besser et al. | |
| 6,107,182 A | 8/2000 | Asahina et al. | |
| 6,245,659 B1 * | 6/2001 | Ushiyama | 43/620 |
| 6,268,290 B1 | 7/2001 | Taguchi et al. | |
| 6,436,813 B1 | 8/2002 | Oikawa et al. | |
| 6,445,001 B2 | 9/2002 | Yoshida | |

FOREIGN PATENT DOCUMENTS

| | | | | |
|---|---|---|---|---|
| JP | 06-005653 | 1/1994 | | |
| JP | 07-078821 | 3/1995 | | |
| JP | 09-092717 | 4/1997 | | |
| JP | 9-092717 | 4/1997 | | H01L/21/768 |
| JP | 9-102492 | 4/1997 | | H01L/21/316 |
| JP | 9-153490 | 6/1997 | | H01L/21/316 |
| JP | 10-233443 | 9/1998 | | |
| JP | 11074352 | * | 3/1999 | |
| JP | 11-074352 | 3/1999 | | |
| JP | 11-121458 | 4/1999 | | |
| JP | 11-145134 | 5/1999 | | |
| JP | 11-317452 | 11/1999 | | |
| JP | 11-317453 | 11/1999 | | |
| JP | 2000-100816 | 4/2000 | | |
| JP | 2000-188333 | 7/2000 | | |

* cited by examiner

… (1)

SEMICONDUCTOR DEVICES AND METHODS FOR MANUFACTURING THE SAME

Japanese Patent Application No. 2000-086607, filed Mar. 27, 2000, is hereby incorporated by reference in its entirety. U.S. patent application Ser. No. 09/817,935 is hereby incorporated by reference in its entirety.

TECHNICAL FIELD

The present invention relates to semiconductor devices and methods for manufacturing the same, including semiconductor devices having a characteristic structure of pad sections (external connection electrodes) and methods for manufacturing the same.

RELATED ART

FIG. 5 shows a cross-sectional view of one example of a conventional bonding pad section. In this example, a pad section 130 is formed in a specified region over an uppermost interlayer dielectric layer 120 that is formed from a PBSG. The pad section 130 is formed from a titanium layer 132, a titanium nitride layer 134 and an aluminum alloy layer 136. A passivation layer 140 is formed over surfaces of the interlayer dielectric layer 120 and the pad section 130. An opening section 142 that forms a bonding region is formed in the passivation layer 140. Wire bonding with, for example, a wire 150 is conducted in the opening section 142.

The bonding pad structure can be formed in the same steps that are conducted to form the first wiring layer. More particularly, the uppermost interlayer dielectric layer 120 is formed in the same step conducted to form a first interlayer dielectric layer. The titanium layer 132 and the titanium nitride layer 134 that compose the pad section 130 are formed in the same steps that are conducted to form a barrier layer between an impurity diffusion layer formed in the semiconductor substrate and a contact section formed in the first interlayer dielectric layer. Further, the aluminum alloy layer 136 is formed in the same step to form the contact section and the first wiring layer.

PROBLEMS WITH THE RELATED ART

In the bonding pad structure shown in FIG. 5, when the bonding wire 150 is bonded to the pad section 130, an exfoliation may occur near the interface between the pad section 130 and the interlayer dielectric layer 120. This type of exfoliation is thought to take place because a weak layer such as a titanium oxide layer is formed near the interface between the titanium layer 132 and the interlayer dielectric layer 120 and thus the coherency between the interlayer dielectric layer 120 and the titanium layer 132 lowers.

SUMMARY

One embodiment relates to a semiconductor device including a pad section over an interlayer dielectric layer. The interlayer dielectric layer includes a first silicon oxide layer that is formed by a polycondensation reaction of a silicon compound and hydrogen peroxide, and a second silicon oxide layer formed over the first silicon oxide layer and containing an impurity. The pad section includes a wetting layer and a metal wiring layer.

Another embodiment relates to a method for manufacturing a semiconductor device, comprising the steps of: (a) forming a interlayer dielectric layer, including (a) (1) forming a first silicon oxide layer by reacting a silicon compound and hydrogen peroxide through a chemical vapor deposition method, (a) (2) forming a second porous silicon oxide layer by reacting a silicon compound, at least one of oxygen and a compound including oxygen, and a compound including an impurity through a chemical vapor deposition method; (b) forming a wetting layer over the interlayer dielectric layer; (c) forming a metal wiring layer over the wetting layer; and (d) forming a pad section by patterning the wetting layer and the metal wiring layer.

Another embodiment relates to a method for manufacturing a semiconductor device, including forming a first silicon oxide layer using a polycondensation reaction of a silicon compound and hydrogen peroxide. The method also includes forming a second silicon oxide layer including an impurity therein. The method also includes forming a pad section over the first silicon oxide layer and the second silicon oxide layer, the pad section including a wetting layer and a wiring layer.

BRIEF DESCRIPTION OF THE DRAWINGS

Embodiments of the invention are described with reference to the accompanying drawings which, for illustrative purposes, are schematic and not necessarily drawn to scale.

DETAILED DESCRIPTION

Figure 1:
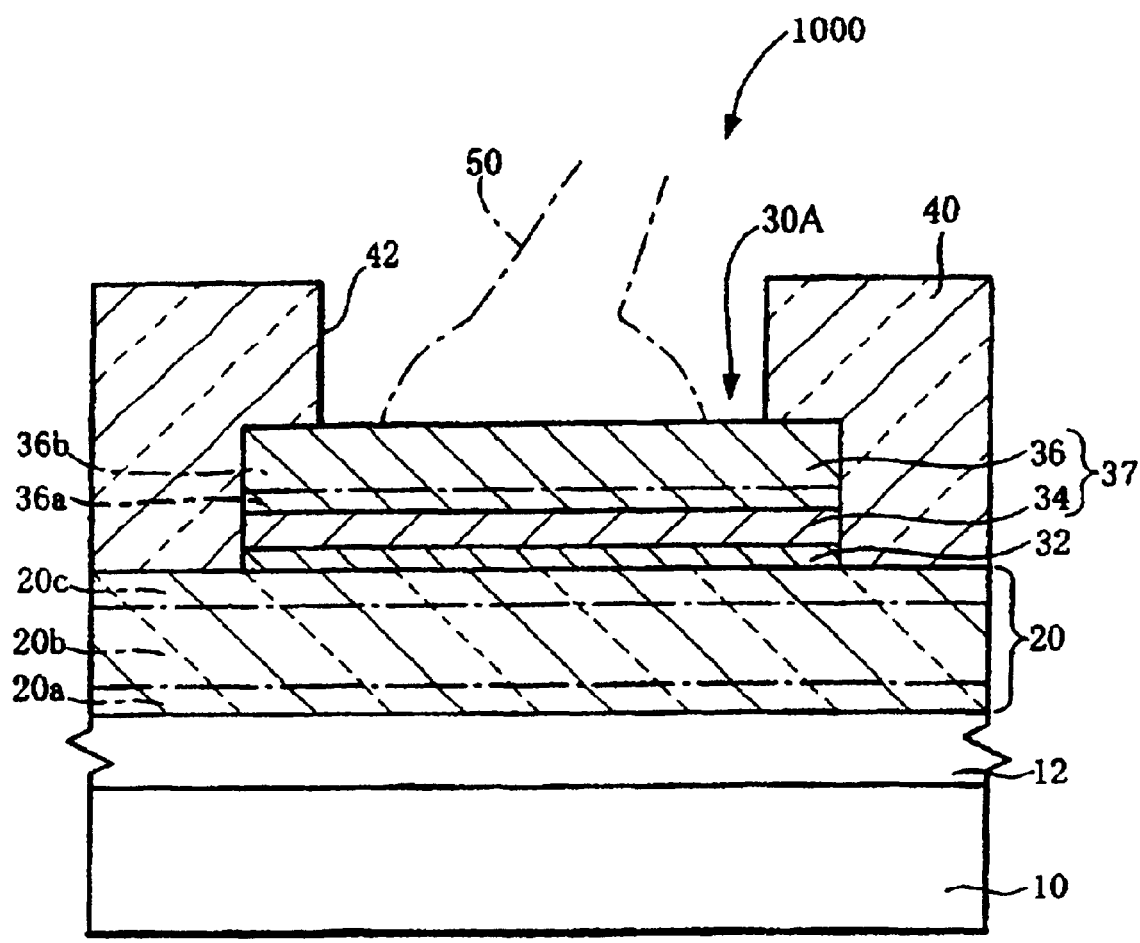
FIG. 1 schematically shows a cross-sectional view of a semiconductor device in accordance with an embodiment of the present invention.

It is an object of certain embodiments of the present invention to provide semiconductor devices having a pad section having an excellent coherency with an interlayer dielectric layer and methods for manufacturing the same.

A semiconductor device in accordance with one embodiment of the present invention comprises: a pad section over an interlayer dielectric layer, wherein the interlayer dielectric layer includes a first silicon oxide layer that is formed by a polycondensation reaction of a silicon compound and hydrogen peroxide, and a second silicon oxide layer formed over the first silicon oxide layer and containing an impurity, and the pad section includes a wetting layer and a metal wiring layer.

In the semiconductor device embodiment describe above, since the interlayer dielectric layer below the pad section includes the first silicon oxide layer that is formed by a polycondensation reaction of a silicon compound and hydrogen peroxide, and the second silicon oxide layer that contains an impurity and is formed over the first silicon oxide layer, the surface of the interlayer dielectric layer can have a greater roughness. As a result, the coherency between the interlayer dielectric layer and the pad section can be greatly improved, and therefore the occurrence of the problems such as exfoliation of the pad section during the bonding step can be inhibited or prevented.

In a semiconductor device in accordance with certain embodiments of the present invention, one or more of the following aspects may preferably be provided.

(1) The metal wiring layer may preferably include an alloy layer that contacts the wetting layer, wherein the alloy layer may preferably include a material that forms the wetting layer and a material that forms the metal wiring layer. The alloy layer may preferably have a film thickness that is up to about two to three times greater than a film thickness of the wetting layer. For example, when the wetting layer has a film thickness of 15–80 nm, the alloy layer has a film thickness of 15–240 nm. Because of the presence of the alloy layer, the amount of a material composing the wetting layer that is supplied to the interlayer dielectric layer can be relatively reduced. This prevents the formation of a reaction material of the material composing the wetting layer and the material composing the interlayer dielectric layer, such as, for example, a weak layer of titanium oxide, and thus improves the coherency of the pad section with respect to the interlayer dielectric layer.

(2) The pad section preferably does not include a nitride layer having a barrier function, such as, for example, a titanium nitride layer. Because a nitride layer is preferably not present, the reaction between the material composing the wetting layer and the material composing the metal wiring layer is not hindered, and a reaction layer (the alloy layer) of the both layers can be readily formed.

A method for manufacturing a semiconductor device in accordance with certain embodiments of the present invention may include the following steps (a)–(d):

(a) forming an interlayer dielectric layer, step (a) including the sub-steps of:

(a) (1) forming a first silicon oxide layer by reacting a silicon compound and hydrogen peroxide through a chemical vapor deposition method, (a) (2) forming a second porous silicon oxide layer by reacting a silicon compound, at least one of oxygen and a compound including oxygen, and a compound including an impurity through a chemical vapor deposition method;

(b) forming a wetting layer over the interlayer dielectric layer;

(c) forming a metal wiring layer over the wetting layer; and (d) forming a pad section by patterning the wetting layer and the metal wiring layer.

In the method described above for manufacturing a semiconductor device, the interlayer dielectric layer having an excellent coherency with respect to the wetting layer can be formed by step (a).

The main steps are described below in detail.

In step (a) (1), the first silicon oxide layer is formed by reacting a silicon compound and hydrogen peroxide through a chemical vapor deposition method. As a result, the layer having an excellent planarization can be formed. In other words, the silicon oxide layer formed in step (a) (1) itself has a high flowability and excellent self-planarization characteristics. This phenomenon is believed to take place due to the following mechanism.

When a silicon compound and hydrogen peroxide are reacted by the chemical vapor phase growth method, silanol is formed in the vapor phase, and the silanol deposits on the surface of the wafer to provide a layer having a high flowability.

For example, when monosilane is used as a silicon compound, silanol is formed by reactions defined by formulae (1) and (1)' as follows:

$$SiH_4 + 2H_2O_2 \rightarrow Si(OH)_4 + 2H_2 \qquad \text{Formula (1):}$$

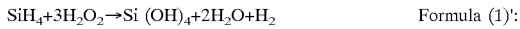

$$SiH_4 + 3H_2O_2 \rightarrow Si(OH)_4 + 2H_2O + H_2 \qquad \text{Formula (1)':}$$

Silanol formed by the reactions defined by Formulae (1) and (1)' becomes silicon oxide as a result of disconnection of water by a polycondensation reaction defined by Formula (2) as follows:

$$Si(OH)_4 \rightarrow SiO_2 + 2H_2O \qquad \text{Formula (2):}$$

The silicon compound may include, for example, an inorganic silane compound, such as, for example, monosilane, disilane, $SiH_2Cl_2$, $SiF_4$, $CH_3SiH_3$ and the like or an organo silane compound, such as, for example, tripropyl-silane, tetraethylorthosilicate and the like.

Also, the film growth step (a) (1) may preferably be conducted by a reduced pressure chemical vapor phase growth method at temperatures of 0–20° C. when the silicon compound is an inorganic silicon compound, and at temperatures of 100–150° C. when the silicon compound is an organic silicon compound. If the temperature during the film forming step is higher than the upper limit of the above-described temperature ranges, the polycondensation reaction defined by Formula (2) may progress excessively. As a result, the flowability of the silicon oxide layer lowers and therefore it is difficult to obtain good planarization. On the other hand, if the temperature is lower than the lower limit of the above-described temperature ranges, the control of a film forming apparatus may become difficult. For example, adsorption of cracked water content may occur within the chamber and dew condensation may occur outside the chamber.

The film thickness of the first silicon oxide layer may not be limited to a specific range. However, the film thickness may preferably be between 300 and 1000 nm. If the film thickness of the first silicon oxide layer exceeds over the above-described upper limit, cracks may occur due to stresses of the layer itself.

Then, in step (a) (2), the porous second silicon oxide layer is formed over the first silicon oxide layer by a chemical vapor deposition method through a reaction of a silicon compound, at least one of oxygen and a compound including oxygen, and a compound including impurity.

The surface of the second silicon oxide layer microscopically has a great roughness (interface roughness), and therefore can have a greater contact surface with the wetting layer. As a result, the coherency between the interlayer dielectric layer and the wetting layer can be increased.

Furthermore, the second silicon oxide layer not only functions as a cap layer, but also preferably functions, due to its own porosity, to gradually release gases externally that are generated from the first silicon oxide layer in an anneal treatment that may be conducted in a later stage. Furthermore, the second silicon oxide layer may relieve stresses of the layer due to its porous structure. When an impurity such as phosphorous or boron, preferably phosphorous, is added to the second silicon oxide layer, the layer can also relieve stresses by weakening the molecular bonding force between Si and O molecules of the silicon oxide that forms the layer, in addition to the effects provided by its porous structure. In other words, the layer is moderately soft but hard enough to resist cracks. Also, the impurity such as phosphorous contained in the second silicon oxide layer may act as a getter of mobile ions, such as alkali-ions that have deteriorating effects on the device-reliability characteristics. The concentration of the impurity contained in the second silicon oxide layer may preferably be 1–6 wt %, in view of the above-described gettering function and the stress relieving function of the layer.

Also, the second silicon oxide layer preferably has a compressive stress of 100–600 MPa, and therefore may act to inhibit or prevent the generation of cracks due to an increased tensile stress that is caused in the first silicon oxide layer when it undergoes the polycondensation. Further, the second silicon oxide layer preferably acts to prevent the first silicon oxide layer from absorbing moisture.

Step (a) (2) may preferably be conducted by a plasma chemical vapor deposition method at temperatures of 300–450° C. at a high frequency of 1 MHz or lower. By conducting the film growth under this temperature condition, gasification components are more readily removed in an initial stage of an anneal process that is conducted after step (a), and therefore the device reliability improves.

Also, the compound including oxygen that is used in step (a) (2) may preferably be dinitrogen monoxide ($N_2O$). By the use of dinitrogen monoxide as a reactant gas, the dinitrogen monoxide in the form of plasma likely reacts with hydrogen bond (—H) of the silicon compound that forms the first silicon oxide layer. As a result, disconnection of gasification components (hydrogen, water) from the first silicon oxide layer is promoted even while the second silicon oxide layer is being formed.

Alternatively, step (a) (2) may be conducted by a normal pressure chemical vapor deposition method at temperatures of 300–550° C., instead of the plasma chemical vapor deposition method. In this case, the compound including oxygen used in step (a) (2) may preferably be ozone.

Also, before the second silicon oxide layer is formed in step (a) (2), the first silicon oxide layer may preferably be exposed to an ozone atmosphere. Since ozone likely reacts with hydrogen bond (—H) and hydroxyl (—OH) of the silicon compound that forms the first silicon oxide layer, disconnection of hydrogen and water from the first silicon oxide layer is promoted.

Also, the thickness of the second silicon oxide layer may preferably be 100 nm or greater in view of the planarization and prevention of cracks.

After step (a), an anneal treatment may preferably be conducted at temperatures of 600–850° C. As a result, the first and second silicon oxide layers formed in step (a) increase their density and improve their insulation capability and resistance to humidity.

More specifically, the first silicon oxide layer completes the polycondensation reaction defined by Formula (2) in an initial stage of the anneal treatment, and water and hydrogen that are generated as a result of the reaction are discharged externally through pores of the second silicon oxide layer. As a result, the first silicon oxide layer with a high density is formed with gasification components being sufficiently removed. Also, the second porous silicon oxide layer becomes a dense layer due to the anneal treatment.

In this anneal treatment, when the temperature is 600° C. or higher, the first and second silicon oxide layers have a sufficient density, and, for example, can sufficiently activate impurities in the source and drain diffusion layers that form a MOS device element. When the anneal temperature is 850° C. or lower, the interlayer dielectric layer can be planarized at a temperature lower than the temperature required to form a conventional BPSG layer, and the first and second silicon oxide layers can be made sufficiently dense. If the anneal temperature is higher than 850° C., the source and drain diffusion layers expand more than required and problems such as punch-through and the like occur. As a result, device miniaturization may become impossible.

Since the porous second silicon oxide layer is formed on the first silicon oxide layer, the second silicon oxide layer having an adequate softness may absorb stresses in the first silicon oxide layer even when a drastic temperature difference occurs, for example, when the wafer is directly placed in an atmosphere of 600–850° C. in the anneal treatment after step (a). Accordingly, the anneal treatment can be conducted without causing cracks in the first silicon oxide layer.

The anneal treatment after step (a) may preferably conducted by a lamp anneal in which the temperature is continuously or intermittently raised to more securely prevent the generation of cracks in the first silicon oxide layer.

Further, the metal wiring layer may preferably be provided by forming a first aluminum layer composed of aluminum or an alloy containing aluminum as a main component at temperatures of 200° C. or lower, then forming a second aluminum layer composed of aluminum or an alloy containing aluminum as a main component at temperatures of 300° C. or higher, and more preferably at 420–460° C. As a result, the alloy layer with a good coverage can be more securely formed.

The alloy containing aluminum as a main component may be an alloy including at least one component, two components or three or more components selected from copper, silicon, germanium, magnesium, cobalt and beryllium, for example.

The wetting layer may preferably be formed from a material selected from titanium, cobalt, zirconium, silicon and niobium.

Certain preferred embodiments of the present invention are described below with reference to the accompanying drawings.

Figure 2:
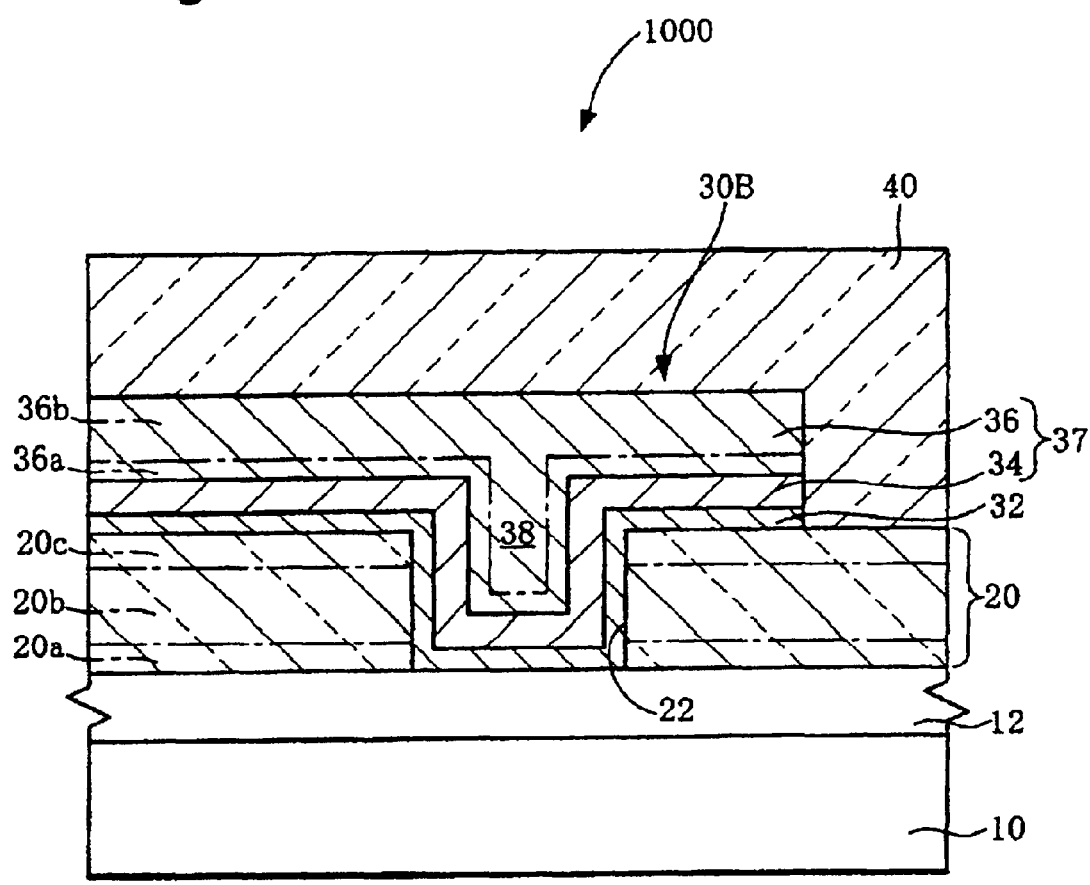
FIG. 2 schematically shows a cross-sectional view of a semiconductor device in accordance with an embodiment of the present invention.

FIGS. 1 and 2 schematically show cross-sectional views of a semiconductor device 1000 in accordance with an embodiment of the present invention. FIG. 1 shows a region where a pad section 30A is formed. FIG. 2 shows a wiring layer 30B that is formed in the same step in which the pad section 30A is formed.

As shown in FIGS. 1 and 2, the semiconductor device 1000 has an intermediate region 12 formed over a silicon substrate 10. An uppermost interlayer dielectric layer 20 is formed over the intermediate region 12. The pad section 30A and the wiring layer 30B are formed in specified regions over the uppermost interlayer dielectric layer 20. Furthermore, a passivation layer 40 is formed over surfaces of the interlayer dielectric layer 20, the pad section 30A and the wiring layer 30B.

Each of the layers is described below.

Semiconductor devices such as, for example, MOSFETs, bipolar transistors and the like, wiring layers and element isolation regions are may be formed on or over surfaces of the silicon substrate 10.

The intermediate region 12 has a known layered structure (although not shown) having one or more sets of an interlayer dielectric layer in which an interlayer contact layer such as a contact layer or a via-contact layer is formed and a dielectric layer in which a wiring layer is provided formed over the silicon substrate 10 in which the semiconductor devices are formed.

Preferably, the present embodiment does not include a barrier layer (such as a nitride layer) typically required for a wiring layer in a first layer. Accordingly, the interlayer dielectric layer 20 and the pad section 30A may preferably be formed in the same steps in which layers above a second layer, and more preferably an uppermost interlayer dielectric layer and a wiring layer are formed.

The uppermost interlayer dielectric layer 20 is preferably formed from three silicon oxide layers, i.e., a third silicon oxide layer 20a, a first silicon oxide layer 20b and a second silicon oxide layer 20c in this order from the bottom. Manufacturing methods for the respective layers are described below.

The third silicon oxide layer 20a is provided if needed, and functions as a base layer. Therefore, the third silicon oxide layer 20a may preferably be formed with a relatively dense layer.

The first silicon oxide layer 20b is formed by a polycondensation reaction of a silicon compound and hydrogen peroxide. The first silicon oxide layer 20b is formed from a layer having a good planarization, as described above.

The second silicon oxide layer 20c includes an impurity, and is formed from a layer having a large interface roughness, as described above.

The interlayer dielectric layer 20 may include at least the first and second silicon oxide layers 20b and 20c, and may also include other dielectric layers.

The pad section 30A and the wiring layer 30B have the same layered structure. In other words, the pad section 30A and the wiring layer 30B have a wetting layer 32 and a metal wiring layer 37 in this order from the bottom. Moreover, the metal wiring layer 37 is formed from an alloy layer 34 and a metal layer 36.

The wetting layer 32 is preferably formed from at least one material selected from titanium, cobalt, zirconium, silicon and niobium. Due to the presence of the wetting layer 32, the wettability of a via hole 22 shown in FIG. 2 improves. As a result, a contact section 38 that is preferably formed from a low resistance alloy layer 34 and a metal layer 36 can be formed in the via hole 22 with a good coverage. The contact section 38 electrically connects the wiring layer 30B and a wiring layer in a lower level (not shown) in a specified region.

The alloy layer 34 is formed form a material composing the wetting layer 32 and a material composing the metal layer 36. For example, when titanium is used for the wetting layer 32 and an aluminum layer (an aluminum layer or an aluminum alloy layer) is used as the metal wiring layer (the metal layer 36), the alloy layer 34 is mainly composed of a titanium-aluminum alloy. The alloy layer 34 is mainly formed when the metal layer 36 is formed by a high temperature sputtering. Therefore, the film thickness of the alloy layer 34 depends on the sputtering temperature, the thermal history over 350° C. until the process is completed, and the film thickness of the wetting layer. However, the film thickness of the alloy layer 34 may preferably be up to about two to three times greater than a film thickness of the wetting layer 32. For example, when the wetting layer 32 has a film thickness of 15–80 nm, the alloy layer 34 has a film thickness of 15–240 nm.

Because the alloy layer 34 is formed between the wetting layer 32 and the metal layer 36, the amount of a material composing the wetting layer 32 that is supplied to the interlayer dielectric layer 20 can be relatively reduced. This lowers the amount of a reaction material generated from the wetting layer 32 and the interlayer dielectric layer 20, such as, for example, titanium oxide. As a result, this inhibits or prevents the formation of a weak layer in proximity to an interface between the interlayer dielectric layer 20 and the wetting layer 32, which may cause exfoliation of the pad section 30A, and thus improves the coherency of the pad section 30A with respect to the interlayer dielectric layer 20.

An example of a method for manufacturing a semiconductor device in accordance with an embodiments of the present invention is described with reference to FIG. 1 and FIG. 2.

First, semiconductor devices such as MOSFETs, bipolar transistors and the like, wiring layers and element isolation regions (not shown) are formed on or over surfaces of a silicon substrate 10 by a known method.

Then, one or more sets of an interlayer dielectric layer in which an interlayer contact layer such as a contact layer or a via-contact layer is formed and a dielectric layer in which a wiring layer is provided are deposited in layers by a know method to form an intermediate region 12 over the silicon substrate 10 in which the semiconductor devices are formed An interlayer dielectric layer 20 is preferably formed from three silicon oxide layers, i.e., a third silicon oxide layer 20a, a first silicon oxide layer 20b and a second silicon oxide layer 20c in this order from the bottom.

Formation of the third silicon oxide layer 20a may be conducted as follows. First, the third silicon oxide layer 20a having a film thickness of 100–200 nm is formed by, for example, reacting tetraethylorthosilicate (TEOS) and oxygen through a plasma chemical vapor deposition (CVD) method at temperatures of 300–500° C. The silicon oxide layer 20a does not have cuspings and is a dense layer.

Formation of the first silicon oxide layer 20b may then be conducted as follows. The first silicon oxide layer 20b is preferably formed by a CVD method through a reaction between $SiH_4$ and $H_2O_2$ using nitrogen gas as a carrier under a reduced pressure of $2.5 \times 10^2$ Pa or lower, and more preferably $0.3 \times 10^2$–$2.0 \times 10^2$ Pa. The first silicon oxide layer 20b has a film thickness that is greater than at least a step difference in the third silicon oxide layer 20a in a lower level. In other words, the first silicon oxide layer 20b is formed to have a film thickness that sufficiently covers the step difference. A maximum film thickness of the first silicon oxide layer 20b is set such that cracks are not generated in the film. For example, the film thickness of the first silicon oxide layer 20b is preferably greater than a step difference in the underlying layer to achieve an optimum planarization, and may preferably be in a range of 300–1000 nm.

Film formation temperature of the first silicon oxide layer 20b depends on its flowability during the film formation thereof. A high film formation temperature lowers the flowability of the film and deteriorates the planarization. Accordingly, in a preferred embodiment, the film formation temperature is preferably set at about 0–20° C., and more preferably at 0–10° C.

The flow quantity of $H_2O_2$ is not particularly restricted to a specified range. However, for example, the flow quantity may preferably be set at a concentration ratio of 55–65 volume %, and twice or more as that of $SiH_4$. In one embodiment, for example, the flow quantity of $H_2O_2$ is preferably set at a gas flow rate ranging from 100 to 1000 SCCM, in view of the uniformity of films and the throughput.

The first silicon oxide layer 20b formed in this step is in the form of silanol polymer, and has a high level of flowability and a high level of self-planarization characteristic. Also, the first silicon oxide layer 20b has a high level of moisture absorption capability due to numerous hydroxyl (—OH) contained therein.

Formation of the second silicon oxide layer 20c may then be conducted as follows. After being left in the chamber under a reduced pressure for 30–120 seconds to remove some water content from the first silicon oxide layer 20b, and then in succession thereto, a plasma CVD is conducted with the presence of $SiH_4$, $PH_3$ and $N_2O$ gases at temperatures of 300–450° C. at high frequencies of 200–600 kHz. As a result, the gases react with one another and form a PBSG layer (second silicon oxide layer) 20c having a film thickness of 100–600 nm. In a preferred embodiment, the second silicon oxide layer 20c may preferably be formed in succession to the film formation of the first silicon oxide layer 20b in consideration of high moisture absorption capability of the first silicon oxide layer 20b. Alternatively, the second silicon oxide layer 20c may be formed after the first silicon oxide layer 20b is preserved in an atmosphere that does not contain water.

The second silicon oxide layer 20c should preferably be porous such that gasification components such as water, hydrogen and the like contained in the first silicon oxide layer 20b are readily and thoroughly removed in an anneal treatment that is later performed. Accordingly, the second silicon oxide layer 20c may preferably be formed by a plasma CVD method at frequency of 1 MHz or lower, and more preferably at frequency of 200–600 kHz, and at temperatures of 450° C. or lower, and more preferably at temperatures of 300–400° C. Also, in a preferred embodiment, the second silicon oxide layer 20c may preferably contain an impurity such as phosphorous. When the second silicon oxide layer 20c contains such an impurity, the second silicon oxide layer 20c becomes to be more porous, with the result that stresses of the film are alleviated, and the film obtains a gettering effect with respect to alkali ions. The level of concentration of the impurity is determined in consideration of the gettering effect and resistance to stresses. For example, when phosphorous is added as an impurity, the concentration level thereof may preferably be set at 2–6 weight %.

Also, $N_2O$ is used as a compound containing oxygen in the plasma CVD. The use of $N_2O$ promotes separation of hydrogen bonds in the first silicon oxide layer 20b. As a result, gasification components such as water and hydrogen contained in the first silicon oxide layer 20b are removed more securely.

This film thickness of the second silicon oxide layer 20c may be determined in view of its role in adjusting the required thickness of the interlayer dielectric layer and the function of $N_2O$ plasma that promotes separation of hydrogen bonds. In a preferred embodiment, the second silicon oxide layer 20c may have a film thickness of 100 nm or greater, and more preferably a film thickness of 100–600 nm.

An anneal treatment may be conducted in a nitrogen atmosphere at temperatures of 600–850° C. By this anneal treatment, the first silicon oxide layer 20b and the second silicon oxide layer 20c are densified and have good insulation and water-resistance characteristics. When the annealing temperature is set at 600° C. or higher, polycondensation reaction of silanol in the first silicon oxide layer 20b is almost perfectly completed, such that water and hydrogen contained in the film are sufficiently discharged and the film is densified. The annealing temperature at 850° C. or lower does not cause adverse effects such as punch-through, junction leak and the like on diffusion regions for the source and drain. As a result, the device miniaturization can be achieved.

In the anneal treatment, the wafer temperature is preferably elevated in stages or continuously in order to reduce effects of thermal strains against the first silicon oxide layer 20b. In other words, a ramping anneal is preferably conducted. For example, when the wafer is kept at a temperature of about 400° C., and then the temperature is raised to an annealing temperature (600–850° C.), an impurity concentration in the second silicon oxide layer 20c can be substantially lowered. For example, when the impurity is phosphorous, it is confirmed that cracks are not generated in the first silicon oxide layer 20b even when the concentration of phosphorous is 2 weight % or lower, besides the gettering effect obtained with respect to mobile ions.

Next, the interlayer dielectric layer 20 may be planarized by polishing a specified amount of film thickness by a CMP method, as required.

Then, the interlayer dielectric layer 20 may be selectively etched, for example, by an anisotropic etching method using a reactive ion etcher containing $CHF_3$ and $CF_4$ as main gases, to form a via hole 22 (see FIG. 2).

A heat treatment including a degasification process will be described below.

Lamp heating (heat treatment A) is preferably conducted in a lamp chamber under base pressures of $1.5 \times 10^4$ Pa or lower, at temperatures of 150–350° C., and more preferably at temperatures of 150–250° C., for 30–60 seconds. Then, in another chamber where argon gas is introduced at pressures of $1 \times 10^{-1}$–$15 \times 10^{-1}$ Pa, a heat treatment (degasification step: heat treatment B) is conducted at temperatures of 150–550° C. for 30–300 seconds to thereby perform a degasification process.

In this process, first, the entire wafer including its rear surface and side surface may be heat treated in the heat treatment A to remove water content that adheres to the wafer, as a primary object.

Then, in the heat treatment B, mainly, gasification components (O, H, $H_2O$, N) in the interlayer dielectric layer 20 are removed. As a result, generation of gasification components from the interlayer dielectric layer 20 can be prevented during film formation of a wetting layer and an aluminum layer (metal wiring layer) that are conducted in later steps.

In accordance with an embodiment of the present invention, a wetting layer 32, for example, a Ti film may contain several tens atom % of gasification components (O, H, $H_2O$, N) in a solid solution. Accordingly, removal of the gasification components in the interlayer dielectric layer 20 before forming the wetting layer is very effective in successfully forming an aluminum layer in the via hole 22. Unless the gasification components are sufficiently removed from the interlayer dielectric layer 20 below the wetting layer, the gasification components in the interlayer dielectric layer 20 may be discharged and enter the wetting layer during formation of the wetting layer. Further, the gases are separated from the wetting layer when an aluminum layer is formed and come out into an interface between the wetting layer and the aluminum layer, causing deteriorating effects on cohesiveness and flowability of the aluminum layer.

Formation of a wetting layer may be conducted as follows. For example, a titanium layer serving as the wetting layer 32 is formed to a preferred film thickness of 20–70 nm by a sputtering method. The sputtering is preferably conducted at temperatures of 100° C. or lower, and more preferably 25° C. or lower.

The method of forming the wetting layer 32 affects the embedding of the aluminum layer in the via hole 22 for the following reasons. A second aluminum layer 36b formed in the via hole 22 is formed by a sputtering method at high temperatures such as 420–460° C. If the wetting layer is thick in an upper portion of the via hole, a material composing the wetting layer and the aluminum may react to form a compound or an alloy thereof (for example, when the wetting layer is formed from titanium, an aluminum-titanium alloy is formed), such that an upper portion of the via hole is closed by the compound or the alloy, in other words, a pinch-off state is created. In the pinch-off state, flow of aluminum into the via hole is hindered during the film formation of the second aluminum layer, and voids may likely be generated in the aluminum layer.

To inhibit or prevent the generation of such voids, the wetting layer 32 may preferably be formed thickly in the bottom section of the via hole 22 and areas adjacent thereto, and thinly in other areas such as an upper end section and side wall section of the via hole 22. To form the wetting layer 32 having such a controlled film thickness, a collimator sputter method or a long-throw sputter method may preferably be employed. The inventors of the present application confirmed that a good quality aluminum layer can be formed without generating pinch-off or voids in a via hole having a diameter of 2 µm with an aspect ratio being 3 or greater (for example, 3–6) when the wetting layer is formed by these methods.

Before cooling the wafer, a heat treatment (heat treatment F) may be conducted in a lamp chamber under base pressures of $1\times10^4$ Pa or lower at temperatures of about 150–250° C. for 30–60 seconds to remove substances such as water adhered to the substrate.

Before an aluminum film is formed, the substrate temperature may preferably be lowered to about 100° C. or lower, and more preferably to about room temperature to 50° C. This cooling process is important to lower the temperature of the substrate that has been elevated when the wetting layer 32 is sputtered.

By cooling the wafer in the manner described above, the amount of gases which may be discharged from the interlayer dielectric layer 20, the wetting layer 32 and the entire surface of the wafer at the time of film formation of the first aluminum film 36a is reduced to a minimum. As a result, this inhibits or prevents deteriorating effects of the gases which may be adsorbed on the interface between the wetting layer 32 and the first aluminum layer 36a to damage their coverage and cohesiveness.

The cooling process may preferably be conducted commonly using a sputter apparatus having plural chambers with the same structure for forming an aluminum layer. For example, the substrate may be mounted on a stage having a cooling function within the sputter apparatus, and the temperature of the substrate may be lowered to a specified temperature.

Film formation of a conductive layer such as aluminum may be conducted as follows. First, a first aluminum layer 36a is formed by sputtering aluminum containing 0.2–1.0 weight % copper at a high speed at temperatures of 200° C. or lower, and more preferably at 30–100° C. to a film thickness of 150–300 µm. Then, the substrate temperature is elevated to 420–460° C. in the same chamber, and aluminum similarly containing copper is sputtered at a low speed to form a second aluminum layer 36b having a film thickness of 300–600 nm. In this film formation step, the level of "high speed" for film formation of the aluminum layers may vary depending on the film forming condition and design specifications of a device to be manufactured. However, in this embodiment, the terms "high speed" refer to sputtering speeds of about 10 nm/second or faster, and the terms "low speed" refer to sputtering speeds of about 3 nm/second or slower.

Aluminum sputtering may preferably be performed in the sputter apparatus that is used to cool the wafer before the aluminum layer is formed. In this manner, the cooling process and the aluminum film forming process are conducted in the same apparatus. As a result, the number of steps required for moving and mounting substrates is reduced, and therefore the process is simplified and pollution of the substrates is prevented.

By successively forming the first aluminum layer 36a and the second aluminum layer 36b in the same chamber, the temperature and the power can be precisely controlled and stable aluminum layers are effectively formed at lower temperatures compared to the conventional technique.

The film thickness of the first aluminum layer 36a is selected to be in an appropriate range in view of the capability of forming successive layers with good step coverage and the capability of suppressing discharge of gasification components from the wetting layer 32 and the interlayer dielectric layer 20 below the aluminum layer 36a. For example, the film thickness may preferably be 200–400 nm. The film thickness of the second aluminum layer 36b may be determined by the size of the via hole 22 and its aspect ratio. For example, the film thickness of 300–1,000 nm is necessary to cover a via hole having a diameter of 0.5 µm or smaller with an aspect ratio of about 3.

Further, an antireflection layer having a film thickness of 30–80 nm may be formed by sputter-depositing titanium nitride (TiN) in another sputter chamber. Then, deposited layers having the wetting layer 32, the first aluminum layer 36a, the second aluminum layer 36b and the antireflection layer 37 are selectively etched, using an anisotropic dry etcher containing $Cl_2$ and $BCl_3$ gases as main components, to pattern the pad section 30A and the wiring layer 30B.

A passivation layer 40 may be formed by a known method. Then, an opening section 42 is formed in the passivation layer 40 to expose a specified region of the pad section.

Results of experiments conducted on the semiconductor devices in accordance with embodiments of the present invention are described below. Samples used in the experiments are provided as follows:

(a) Sample in accordance with an embodiment of the present invention:

A silicon oxide layer as the interlayer dielectric layer 20, a titanium layer as the wetting layer 32 having a film thickness of 45 nm, and an aluminum layer as the metal wiring layer 37 having a film thickness of 550 nm were deposited in layers over a silicon substrate. The metal wiring layer 37 is composed of a first aluminum layer formed at a sputtering temperature of 100° C. and a second aluminum layer formed at a sputtering temperature of 460° C. The alloy layer 34 of the sample had a film thickness of about 100 nm.

The silicon oxide layer forming the interlayer dielectric layer 20 includes a layered structure including three layers of the following thickness and materials.

Third silicon oxide layer: a layer formed by a plasma CVD method using TEOS and oxygen, having a film thickness of 100 nm, First silicon oxide layer: a layer formed by a CVD method using monosilane and hydrogen peroxide, and Second silicon oxide layer: a layer formed by a plasma CVD method using monosilane, $PH_3$ and $N_2O$.

(b) Comparison sample:

A comparison sample was formed from a CVD layer using TEOS instead of a silicon oxide layer of the sample of the embodiment of the present invention, and includes a titanium nitride layer having a thickness of 100 nm between the wetting layer and the aluminum layer. It is confirmed that almost no alloy layer is formed in this sample.

Figure 3:
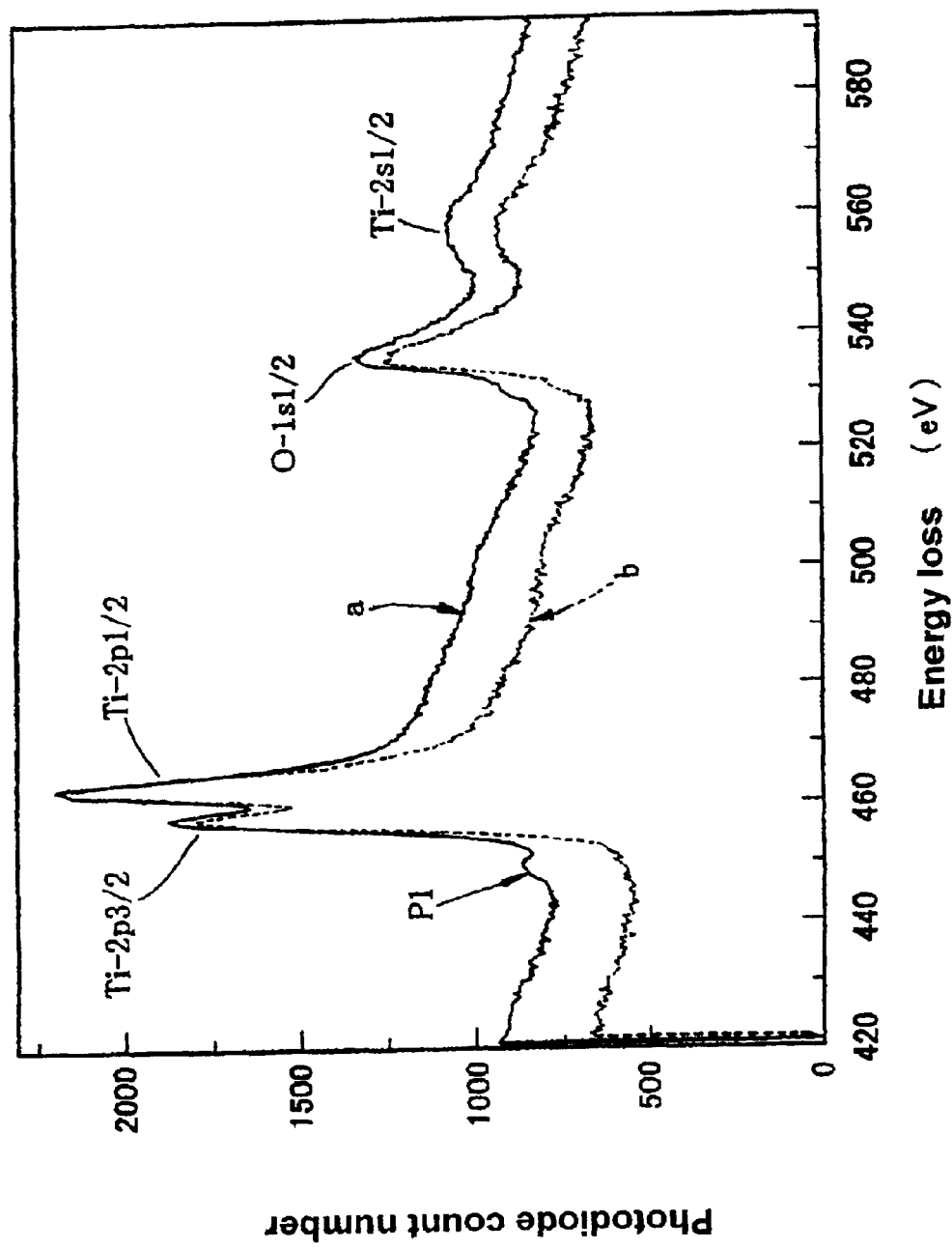
FIG. 3 is a graph showing spectrums obtained by an electron beam energy loss spectrum analysis of a sample semiconductor device in accordance with an embodiment of the present invention and a comparison sample.

An EELS (Electron Beam Energy Loss Spectrum) analysis was conducted to obtain spectrums at an interface between the interlayer dielectric layer 20 and the wetting layer 32 at the pad section 30. The results are shown in FIG. 3. In FIG. 3, energy losses are indicated along a horizontal axis and photodiode count numbers are indicated along a vertical axis. Also, referring to FIG. 3, a spectrum indicated by a reference "a" is of the sample of the embodiment of the present invention, and a spectrum indicated by a reference "b" is of the comparison sample.

Referring to FIG. 3, the spectrum of the sample of the embodiment of the present invention indicated by the reference "a" has a peak P1 in an energy side lower than Ti-2P2/2 (near 444 KeV), which is not present in the spectrum of the comparison sample indicated by the reference "b". This peak is thought to derive from silicon.

In this manner, in the semiconductor device in accordance with the embodiment of the present invention, peaks of silicon exist generally at peak positions of titanium. Accordingly, it is assumed that a reacted layer of titanium and silicon (a titanium silicide layer) exists in the semiconductor device. It is also believed that, due to the presence of the silicide layer having a high coherency between the wetting layer 32 and the interlayer dielectric layer 20, these layers are strongly bonded together.

Cross sections of the sample of the embodiment of the present invention and the comparison sample were analyzed by a transmission electron microscope (TEM). As a result, it was confirmed that the roughness of the interface between the wetting layer 32 and the interlayer dielectric layer 20 (the titanium layer and the second silicon oxide layer) in the sample of the present embodiment is about five times greater than the roughness of the interface between the wetting layer and the interlayer dielectric layer (the titanium layer and the second silicon oxide layer using TEOS) in the comparison sample. The roughness of the interface means heights between concave and convex in the interface. More specifically, while the roughness of the interface of the sample of the present embodiment is about 5 nm, the roughness of the interface of the comparison sample is about 1 nm.

Peeling strengths of the sample of the present embodiment and the comparison sample were observed by the following method.

Figure 4:
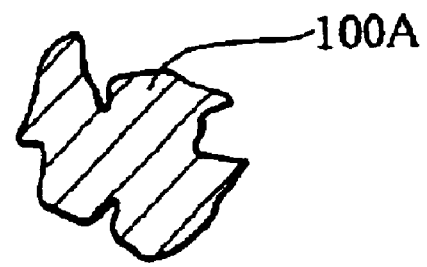
FIGS. 4(a) and 4(b) show results of peeling tests conducted on a sample semiconductor device in accordance with an embodiment of the present invention and a comparison sample.
Figure 4:
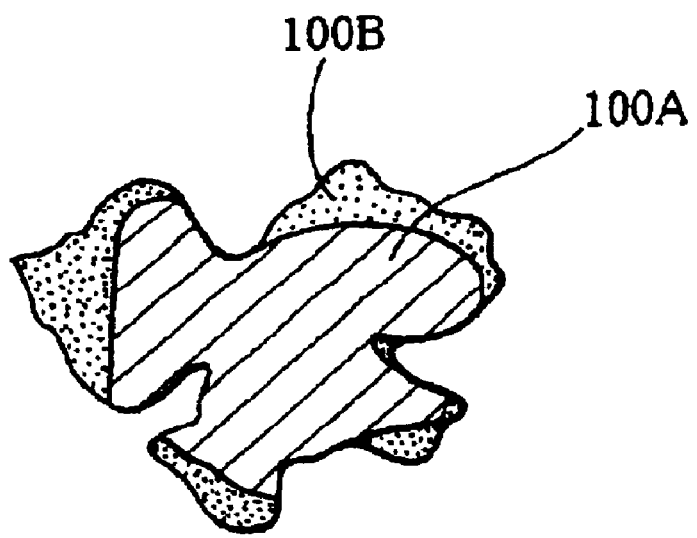
Figure 5:
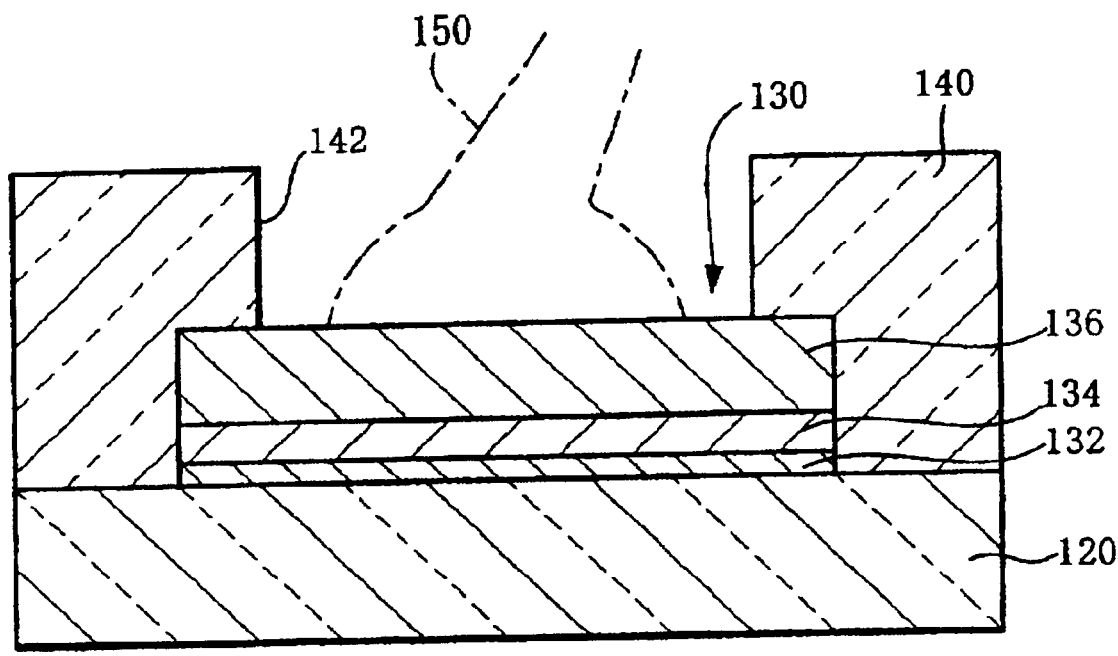
FIG. 5 schematically shows a cross-sectional view of one example of a conventional semiconductor device.

(a) A pen with a diamond tip is dropped onto the surfaces of the samples from a specified height (2–3 cm).
(b) Adhesive tape is adhered to the surfaces of the samples, and then the adhesive tape is peeled.
(c) The surfaces of the samples are observed by a microscope to check the peeling conditions of the wetting layers. FIGS. 4(a) and 4(b) show surface conditions of the samples illustrated based on the microscopic photos.

FIG. 4(a) shows the surface condition of the sample of the present embodiment. It is observed from the figure that, although the sample of the present embodiment has a destroyed section 100A caused by the dropped pen, peeling of the wetting layer is not found.

FIG. 4(b) shows the surface condition of the comparison sample. It is observed from the figure that the comparison sample has a destroyed section 100A caused by the dropped pen, and also a peeled section 100B of the wetting layer.

Certain embodiments of the present invention may have the following characteristics.

(a) As the second silicon oxide layer 20c is formed over the first silicon oxide layer 20b, the coherency between the interlayer dielectric layer 20 and the wetting layer 32 is increased, and the mechanical strength of the pad section 30A can be improved. In other words, the second silicon oxide layer 20c microscopically has a large surface roughness (interface roughness), and therefore the contact area with the wetting layer 32 becomes large. As a result, the coherency between the interlayer dielectric layer 20 and the wetting layer 32 is increased.

Furthermore, the second silicon oxide layer 20c not only as a cap layer, but also acts, due to its own porosity being greater than that of the first silicon oxide layer 20b, to effectively release gases externally that are generated from the first silicon oxide layer 20c in an anneal treatment to be conducted in a later stage of the manufacturing process. Furthermore, since the second silicon oxide layer 20c includes an impurity such as phosphorous or boron, the layer is moderately soft but hard enough to resist cracks, and the layer can also relieve stresses when an external force is applied to the interlayer dielectric layer 20.

(b) The first silicon oxide layer 20b is composed of a material including silanol having a high flowability, which is produced in a reaction between a silicon compound and hydrogen peroxide. As a result, the roughness of the surface of the wafer is highly planarized when the layers are formed, and the interlayer dielectric layer 20 having an excellent planarization can be formed.

(c) The metal wiring layer 37 has the alloy layer 34 that contacts the wetting layer 32.

The alloy layer 34 is formed from an alloy of a material composing the wetting layer 32 and a material composing the metal layer 36. Due to the presence of the alloy layer 34, the material composing the wetting layer 32 is used for forming the alloy layer 34, and therefore the amount of the material composing the wetting layer 32 that is supplied to the interlayer dielectric layer 20 can be relatively reduced. As a result, this prevents the formation of a weak layer of a reaction material generated from the materials composing the wetting layer 32 and the interlayer dielectric layer 20, such as, for example, titanium oxide. In this respect, the coherency of the pad section 30A is improved with respect to the interlayer dielectric layer 20.

(d) The interlayer dielectric layer 20 and the pad section 30A are formed with second layers or above. As a result, a nitride layer having a barrier function (for example, a titanium nitride layer) is not present between the wetting layer and the metal wiring layer. Because the pad section 30A does not have a nitride layer, the reaction between the material composing the wetting layer 32 and the material composing the metal layer 37 is not hindered, and therefore an alloy layer of the both materials (a titanium-aluminum alloy) is readily formed. As a result, the effect (c) described above is more securely achieved.

The present invention is not limited to the embodiments described above, and parts thereof can be modified, for example, as follows.

(a) In the embodiment described above, when the second silicon oxide layer 20c is formed by a plasma CVD method, dinitrogen monoxide is used as a compound including oxygen. In an alternative embodiment, ozone may be used instead. The wafer may preferably be exposed to an ozone atmosphere before the second silicon oxide layer 20c is formed.

By using ozone instead of dinitrogen monoxide, a silicon oxide layer can be formed with TEOS by a normal pressure CVD.

Also, by exposing the wafer W to an ozone atmosphere, it has been confirmed by a thermal desorption spectroscopy (TDS) and a Fourier-transform infrareds spectroscopy (FTIR) that the first silicon oxide layer 20b has a low moisture absorption characteristic and contains a sufficiently low level water content. Further, the interlayer dielectric layer has a good planarization characteristic and the MOS transistor has a good characteristic comparable to those formed by using dinitrogen monoxide as a reactive gas. Also, it has been confirmed that the first silicon oxide layer 20b does not generate cracks.

(b) In the embodiment described above, a silicon oxide layer as the third silicon oxide layer 20a is formed by a plasma CVD using TEOS. Other types of silicon oxide layers may be used instead. For example, as the third silicon oxide layer of this kind, a layer may be formed by a reduced-pressure thermal CVD using monosilane and dinitrogen monoxide. The silicon oxide layer thus formed faithfully follows the surface contour of the underlying silicon substrate, and has a high degree of coverage characteristic. The film thus formed is dense and therefore has a high passivation characteristic. Also, cracks are unlikely to occur in the first silicon oxide layer 20b even when anneal temperature is rapidly raised in an anneal treatment. Further, the thermal CVD method provides an advantage in that plasma damage is not caused.

The present invention is not limited to the embodiments described above, and many modifications can be made within the scope of the subject matter of the present invention.

What is claimed:

1. A method for manufacturing a semiconductor device comprising the steps of:
   (a) forming a interlayer dielectric layer, the step including:
      (a)(1) forming a first silicon oxide layer by reacting a silicon compound and hydrogen peroxide through a chemical vapor deposition method, and
      (a)(2) forming a second porous silicon oxide layer by reacting a silicon compound, at least one of oxygen and a compound including oxygen, and a compound including an impurity through a chemical vapor deposition method;
   (b) forming a wetting layer over the interlayer dielectric layer;
   (c) forming a metal wiring layer over the wetting layer;
   (d) forming a pad section by patterning the wetting layer and the metal wiring layer; and
   after the step (a), the step of conducting an anneal treatment at a temperature of 600–850° C.

2. A method for manufacturing a semiconductor device according to claim 1, wherein the silicon compound used in the step (a)(1) is at least one type selected from an inorganic silane compound including monosilane, disilane, $SiH_2Cl_2$ and $SiF_4$, or an organo silane compound including $CH_3SiH_3$, tripropyl-silane and tetraethylorthosilicate.

3. A method for manufacturing a semiconductor device according to claim 1, wherein the step (a)(1) is conducted with the silicon compound being an inorganic silane compound by a reduced pressure chemical vapor deposition method at a temperature of 0–20° C.

4. A method for manufacturing a semiconductor device according to claim 1, wherein the step (a)(1) is conducted with the silicon compound being an organo silane compound by a reduced pressure chemical vapor deposition method at a temperature of 100–150° C.

5. A method for manufacturing a semiconductor device according to claim 1, wherein the step (a)(2) is conducted, by a plasma chemical vapor deposition method at a temperature of 300–450° C.

6. A method for manufacturing a semiconductor device according claim 5, wherein the compound including oxygen used in the step (a) (2) is dinitrogen monoxide.

7. A method for manufacturing a semiconductor device according to wherein the step (a)(2) is conducted by a chemical vapor deposition method at a temperature of 300–550° C.

8. A method for manufacturing a semiconductor device according to claim 7, wherein the compound including oxygen used in the step (a) (2) is ozone.

9. A method for manufacturing a semiconductor device according to claim 1, wherein, before forming the second silicon oxide layer in the step (a)(2), the first silicon oxide layer is exposed to an ozone atmosphere.

10. A method for manufacturing a semiconductor device according to claim 1, wherein the impurity used in the step (a)(2) is phosphorous.

11. A method for manufacturing a semiconductor device according to claim 1, wherein the metal wiring layer is provided by forming a first aluminum layer including aluminum or an alloy containing aluminum as a main component at a temperature of 200° C. or lower, then forming a second aluminum layer including aluminum or an alloy containing aluminum as a main component at a temperature of 300° C. or higher.

12. A method for manufacturing a semiconductor device, comprising:
   forming a first silicon oxide layer using a polycondensation reaction of a silicon compound and hydrogen peroxide;
   forming a second silicon oxide layer including an impurity therein;
   annealing the first silicon oxide layer and the second silicon oxide layer at a temperature in the range of 600–850° C.; and
   forming a pad section over the first silicon oxide layer and the second silicon oxide layer, the pad section including a wetting layer and a wiring layer.

13. A method as in claim 12, comprising forming the second silicon oxide layer to be more porous than the first silicon oxide layer.

* * * * *